United States Patent [19]

Bodenhausen et al.

[11] Patent Number: 5,521,503

[45] Date of Patent: May 28, 1996

[54] SELECTIVE CONTROL OF MAGNETIZATION TRANSFER IN MULTIPLE-SITE EXCHANGE SYSTEMS

[75] Inventors: Geoffrey Bodenhausen, Pully; Catherine Zwahlen; Sébastien J. F. Vincent, both of Lausanne, all of Switzerland

[73] Assignee: Spectrospin AG, Industriestrasse, Switzerland

[21] Appl. No.: 220,158

[22] Filed: Mar. 30, 1994

[51] Int. Cl.$^6$ ........................................... G01V 3/00
[52] U.S. Cl. ........................................... 324/307; 324/309
[58] Field of Search ........................... 324/300, 306, 324/307, 308, 309, 314

[56] References Cited

U.S. PATENT DOCUMENTS

| 4,714,883 | 12/1987 | Ordidge | 324/309 |
|---|---|---|---|
| 5,050,609 | 9/1991 | Balaban et al. | |
| 5,172,060 | 12/1992 | Knüttel | 324/307 |
| 5,285,156 | 2/1994 | Bodenhausen et al. | 324/307 |
| 5,339,035 | 8/1994 | Scheider | 324/309 |

FOREIGN PATENT DOCUMENTS

| 0515718 | 12/1992 | European Pat. Off. |
|---|---|---|
| 9006523 | 6/1990 | WIPO . |
| 9013827 | 11/1990 | WIPO . |

OTHER PUBLICATIONS

R. G. Bryant et al. "Magnetic Relaxation Coupling in Heterogenous Systems", in: Journal of Magnetic Resonance, vol. 101B, No. 2, 1 Apr. 1993, pp. 121–125.

O. Zerbe et al. "A 13C– and 15N–Edited Triple–Resonance ROESY Experiment", in: Journal of Magnetic Resonance, vol. 100, No. 2, 1 Nov. 1992, pp. 329–335.

G. A. Morris et al. "Direct Observation of the Magnetization Exchange Dynamics Responsible for Magnetization Transfer Contrast in Human Carilage in Vitro", in: Magnetic Resonance in Medicine, vol. 28, No. 1, 1 Nov. 1992, pp. 97–104.

U. Eggenberger et al., "Analysis of Two–Dimensional Nuclear Magnetic Resonance Spectra with Relayed Proton–Proton–Carbon Magnetization Transfer: A Step Forward Automated Structure Elucidation", in: Analytical Chemistry, vol. 61, No. 20, 15 Oct. 1989, pp. 2298–2306.

Primary Examiner—Sandra L. O'Shea
Assistant Examiner—Mack Haynes

[57] ABSTRACT

It is shown that is is possible to inhibit the transfer of magnetization in a chemically exchanging system with several sites in dynamic equilibrium, so that the forward and the backward reaction rates involving two selected species can be studied without being significantly perturbed by other exchange processes. This can be achieved either by selective inversion of the magnetization of the two chosen sites in the course of the reaction interval, or alternatively by inversion of all other sites in the network of exchanging nuclei that one wishes to "decouple" from the selected pair of interest.

11 Claims, 2 Drawing Sheets

SELECTIVE CONTROL OF MAGNETIZATION TRANSFER IN MULTIPLE-SITE EXCHANGE SYSTEMS

BACKGROUND OF THE INVENTION

The invention concerns a method for controlling the transfer of magnetization within an interacting spin system using nuclear magnetic resonance (NMR) in which the spin system is subjected to a homogeneous magnetic field and comprises a source spin component, a target spin component, and one or several perturbing spin components, the method comprising irradiating a first radio frequency (RF) pulse to selectively invert the longitudinal magnetization of the source spin component along a direction of the homogeneous magnetic field and subsequently, at a time $\tau_m/2$ following the first pulse, irradiating a second selectively interacting RF pulse to control the transfer of magnetization from the source spin component to the perturbing spin component and irradiating, at a mixing time $\tau_m$ following the first pulse, a third RF pulse to convert a resulting longitudinal magnetization into a transverse magnetization. A method of this type is known in studies of rate determination of chemical reactions for systems in dynamic equilibrium, where the turnover due to forward and backward reactions precisely cancel each other, so that there is no net transfer of material[1]. In most forms of spectroscopy, there is little or no evidence that any dynamic processes are taking place, since the concentrations remain time-independent, but magnetic resonance allows one to observe the transfer of magnetization rather than the transfer of material, and it is sufficient that the chemical shifts of the nuclei be affected in the course of the chemical reaction to make the exchange apparent. Apart from line-shape studies[2,3], this effect can be exploited in experiments where the longitudinal magnetization of a chosen site is perturbed by selective saturation or inversion[4-7] The exchange processes lead to a distribution of this perturbation in the course of a reaction or "mixing" time $\tau_m$. This effect can be visualized very effectively by two-dimensional exchange spectroscopy (sometimes called EXSY), which is, in many respects, similar to the Nuclear Overhauser Effect Spectroscopy (NOESY)[8,9].

These methods have the disadvantage that in addition to interacting with the spin system of which exchange is to be studied, magnetization also interacts with one or several other spin systems, the so-called perturbing spin system, as well. This additional interaction obscures the characterization of the exchange reaction of the desired spin system and renders analysis of the experiments more difficult.

Similar problems are encountered in Nuclear Overhauser Effect Spectroscopy (NOESY) [8,9]. In these experiments of high resolution nuclear magnetic resonance (NMR) the transfer of longitudinal magnetization from one spin site to another under the effect of cross relaxation (Nuclear Overhauser Effect) is also complicated by spin diffusion pathways through other spins in the vicinity. In this connection a method called "Quenching of Undesirable Indirect External Trouble in Nuclear Overhauser Effect Spectroscopy" (QUIET-NOESY) has been developed[11] to quench these undesired pathways through manipulation of the magnetization of the two sites by means of doubly selective inversion pulses. The experiment is begun through selective inversion of a source spin. The longitudinal magnetization, thereby, tends to migrate not only to a target nuclei but also to various other perturbing nuclei. The migration is controlled by simultaneously inverting the longitudinal magnetization components of both the source and the target spins in the middle of the mixing interval $\tau_m$ without affecting those of the perturbing spin. In this fashion the direct flow of magnetization from the source to the target spin is not perturbed but the indirect flow to the perturbing spins is reversed in sign and almost perfectly cancelled at the end of the relaxation interval $\tau_m$.

It is the purpose of the present invention to develop a method for inhibiting the transfer of magnetization in chemically exchanging systems with several sites in dynamic equilibrium so that the forward- and backward reaction rates involving two selected species can be studied without being significantly perturbed by other exchange processes.

SUMMARY OF THE INVENTION

This method is achieved in a nuclear magnetic resonance experiment in which the spin system comprises a source spin component, a target spin component, and one or several perturbing spin components, and a first radio frequency (RF) pulse is irradiated to selectively invert a longitudinal magnetization of the source spin component, and at a time $\tau_m/2$ following the first pulse, a second selectively inverted RF pulse controls the transfer of magnetization from the source spin component to the target spin and/or the perturbing spin components, while a third pulse, irradiated at a mixing time $\tau_m$ following the first pulse, converts resulting longitudinal magnetization into transverse magnetization, whereby the second RF pulse selectively inverts either the perturbing spin component or the source and target spin components and the third RF pulse is a non-selective pulse to excite all components for observation of a spin component spectrum.

In this fashion, the purpose of the invention is completely achieved. By selective inversion of the magnetization of the two chosen sites in the course of the reaction interval or alternatively by inversion of all other sites in the network of exchanging nuclei that one wishes to "decouple" from the selected pair of interest, it is possible to modify the effective exchange matrices in such a way that the magnetization behaves as if all exchange rates except for those interconnecting a pair of sites were quenched. In actual fact, the chemical exchange proceeds unhindered, and the dynamic equilibrium is not perturbed. It is only the observable magnetization which behaves as if the rates were modified. The new approach is referred to as QUIET-EXSY.

The main distinction between this pulse sequence experiment and that of QUIET-NOESY[11] and of synchronous nutation[18,19] lies in the fact, that exchange matrices, in contrast to the Solomon matrices used to describe cross relaxation, are generally non-symmetric, so that the equilibrium populations may be unequal. Furthermore, the "kinetic window" of possible exchange rates is far wider than the typical range of cross relaxation rates. On the other hand, the number of sites is usually more limited in chemically exchanging systems. One of the chief motivations of this technique is the desire to measure slow exchange rates that tend to be overshadowed by faster competing processes. The scope of the QUIET-EXSY method is quite general, since any arbitrary network of exchanging sites can be unravelled by suitable combinations of (multiply)-selective inversion pulses. In the current day of age of complex experiments, the simplicity of the current method is particularly attractive.

This concept of manipulating the magnetization of systems undergoing chemical reactions is quite new. In a sense this method is a quite fundamental step compared to the introduction of two-dimensional exchange spectroscopy in 1979 by Ernst and co-workers[8,9]. Although two-dimensional exchange spectroscopy gives an elegant presentation of the experiment, the information content is fundamentally the same as what can be derived from selective one-dimensional inversion-recovery techniques (the so-called Hofmann-Forsen method)[4-6]. In contrast thereto, the method of the invention actually modifies the apparent behavior of the reaction to go beyond cosmetic improvement of the presentation. The method distinguishes itself from the QUIET-NOESY method[11] in that the objectives of the two methods are completely different and the analogy between Overhauser effects and chemical reactions is purely of a formal nature.

In this fashion it is therefore possible to inhibit the transfer of magnetization in a chemically exchanging system with several sites in dynamic equilibrium, so that the forward and the backward reaction rates involving two selected species can be studied without being significantly perturbed by other exchange processes, whereby this can be achieved either by selective inversion of the magnetization of the two chosen sites in the course of the reaction interval, or alternatively by inversion of all other sites in the network of exchanging nuclei that one wishes to "decouple" from the selected pair of interest.

In an preferred embodiment of the invention the spin system under investigation is a chemically exchanging system whose sites are in dynamic equilibrium. This embodiment has the advantage that the pulse sequence can be tailored to control undesired magnetization exchange in the systems.

In another embodiment of the invention the first RF pulse is a 180° Gaussian pulse. In a variation of this embodiment the Gaussian pulse is truncated at 2.5%. This has the advantage that the pulse has a short duration and is suitable for studying fast exchange processes.

In another embodiment of the invention the first radio frequency pulse is a $G^3$, I-BURP, $Q^3$ or similar pulse. This embodiment has the advantage that the first pulse is adapted to invert multiplets of finite width.

In a further embodiment of the invention the second selective RF pulse inverts the perturbing spin components. This has the advantage that the magnetization transfer from the source to the target spin system is controlled.

In another embodiment of the invention the second RF pulse selectively inverts both the source and the target spin components. This has the advantage of "decoupling" the source or target spin components' interactions so that transfer of magnetization to the perturbing spins can be suppressed.

In a further advantageous embodiment of the invention the second RF pulse is split into a plurality of n-partial pulses irradiated at time intervals $[(2k+1)/2n]\tau_m$ with k and n integers, and $0 \leq k \leq n-1$. This has the advantage of use to study exchange rates which are fast compared to the time scale over which the mixing interval is sampled since in this case the decoupling is effective to higher order.

Further advantages can be derived from the embodiments discussed below in connection with the drawings. The individual features of the embodiments and of the drawings can be used individually, or collectively in arbitrary combination without departing from the framework of the present invention.

BRIEF DESCRIPTION OF THE DRAWING

FIG. 1a shows a difference spectra obtained by inverting the source resonance selectively in odd transients only, using a 180° Gaussian pulse of 21 ms duration.

FIG. 1b shows a difference spectra for the target spin component corresponding to the experiment of FIG. 1a.

FIG. 1c shows the time development of the perturbing spin component or components associated with the experiment of FIGS. 1a and 1b.

FIG. 1d shows experiments on the system of FIGS. 1a–1c but a selective inversion pulse is applied to the perturbing resonance in the middle of the $\tau_m$ interval for the time development of the source spin system.

FIG. 1e shows the time development of the target spin system in the experiment of FIG. 1d.

FIG. 2 shows a schematic sketch of the pulse sequence of the current invention.

DESCRIPTION OF THE PREFERRED EMBODIMENT

Figure 2:
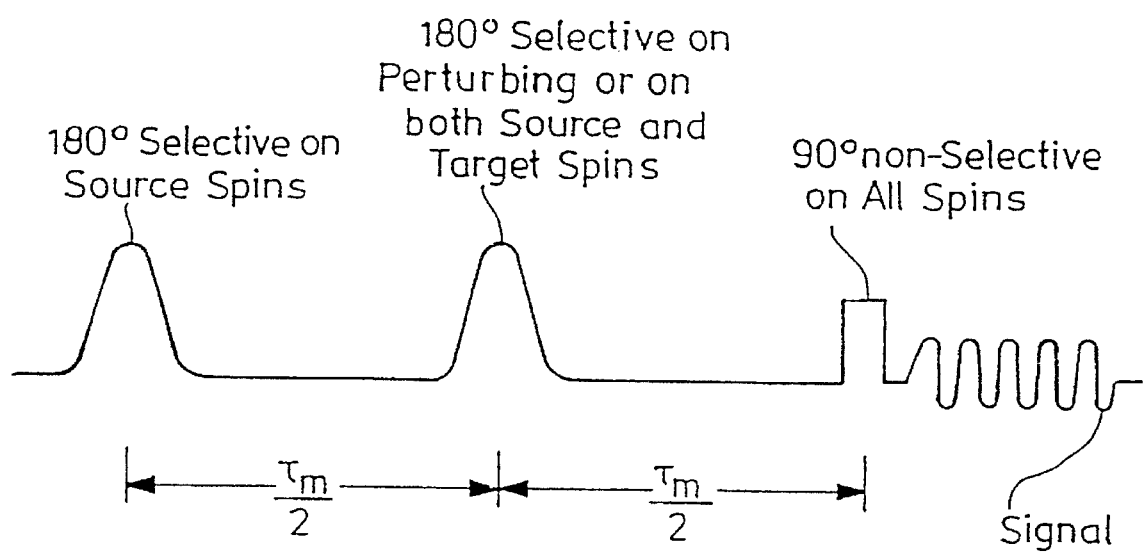
FIG. 2 shows the time development of the perturbing spin system in the experiment corresponding to FIGS. 1d and 1e.

In the schematic pulse sequence embodiment of FIG. 2, the invention displays a first irradiation of a 180° selective Gaussian pulse, irradiated to selectively invert the source spin component. For this experiment the mixing time interval is defined as $\tau_m$. After waiting a time interval $\tau_m/2$ a second selective 180° Gaussian pulse is irradiated to selectively invert either the perturbing spin system or the source and target spin systems simultaneously and thereby to effect a "decoupling" of the magnetization transfer. A subsequent time interval $\tau_m/2$ is then waited before irradiating a hard non-selective pulse to excite all spins including the target and/or the one or several perturbing spins to be observed. Following this excitation, a signal is observed in which the magnetization transfer has been controlled.

FIGS. 1a–1f show the time dependence of proton-decoupled $^{31}$P resonances of source spins trans-ZrCl$_4$L$_2$, target spins cis-ZrCl$_4$L$_2$, and perturbing spins of ligand L=(CH$_3$O$_3$)$_3$PO in CDCl$_3$, prepared as described by Frey et al.[10] and observed in two complementary series of experiments at 250 K with a Bruker MSL 300 spectrometer.

FIGS. 1a through 1c are difference spectra obtained by inverting the source resonance selectively in odd transients only, using a 180° Gaussian pulse of 21 ms duration. The magnetization is allowed to migrate freely from source to target spin components and from source to perturbing spin components during a mixing time $\tau_m$ which is incremented from 0 to 1.5 s. The three resonances are observed after a non-selective 90° pulse of 22 microseconds, and only narrow windows (20 Hz wide) are shown. One notices build-up curves for both conversion processes, and the rates are estimated to be $k_{source \rightarrow target}=5.3$ s$^{-1}$ and $k_{source \rightarrow perturbing}=4.5$ s$^{-1}$.

Figure 1:
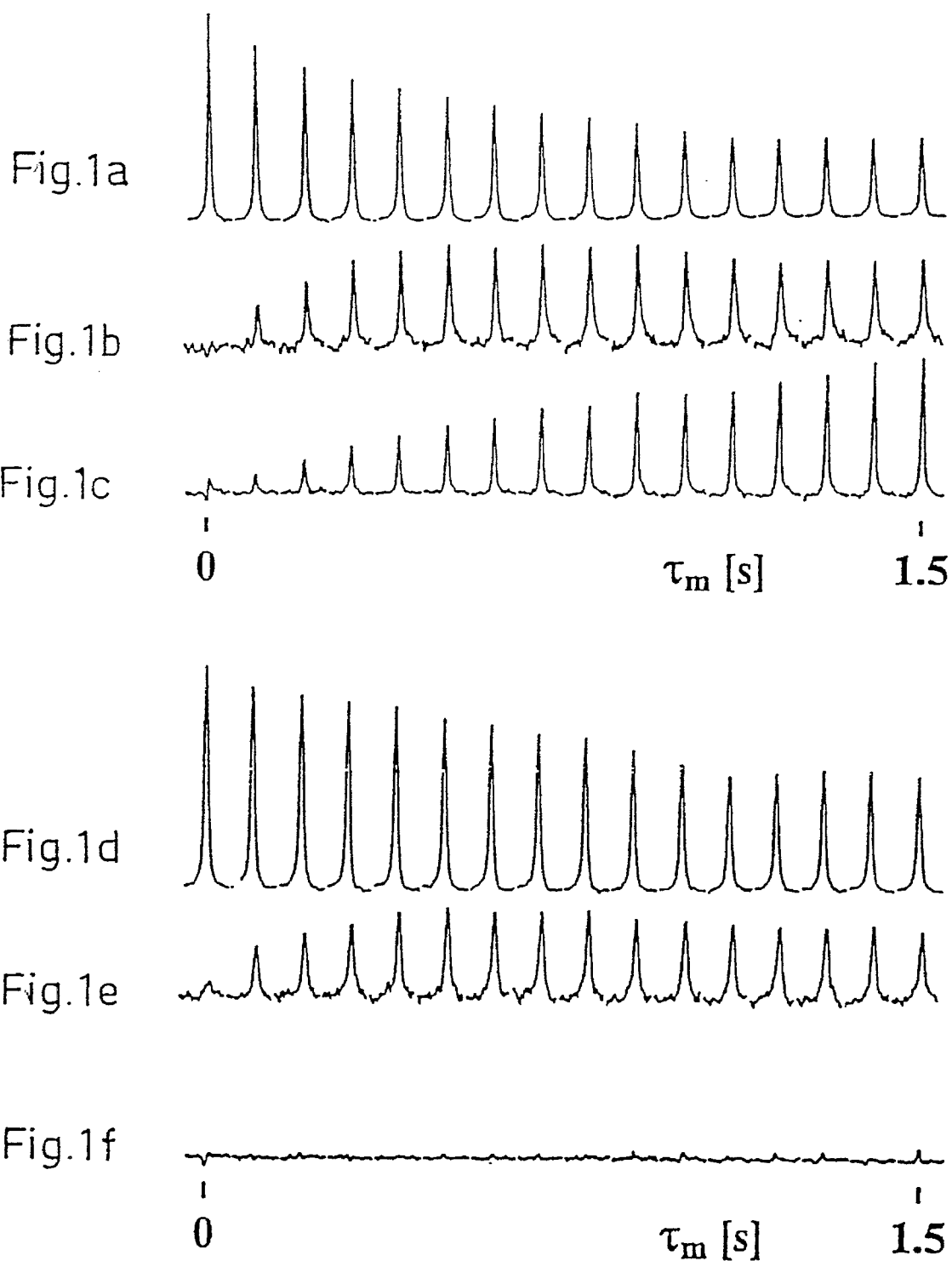

In contrast thereto FIGS. 1d through 1f of FIG. 1 are similar experiments, but with the inventive selective inversion pulse applied to the perturbing resonance in the middle of the $\tau_m$ interval. The conversion of the magnetization from the source spin component to the perturbing spin component is completely inhibited, although the chemical reaction continues to occur unhindered. The conversion of source to target is easily measured by the remaining build-up curve.

The vertical scales of the plots in FIGS. 1a through 1f were amplified with ratios of 1:5:2 in FIGS. 1a through 1c, and 1:3:1.2 in FIGS. 1d through 1f.

The proton-decoupled $^{31}$P spectrum at 250 K and 121.5 MHz of FIGS. 1a through 1f, at atmospheric pressure, consists of three singlets at relative offsets of 0.83 and 791 Hz, which correspond to the phosphate groups of the source, target, and perturbing spins respectively, with approximate relative amplitudes of 4.7:1:14.8. The source resonance can be easily inverted selectively with the 180° Gaussian pulse. The inversion profile of such a $G^1$ pulse truncated at 2.5% is very sharp[12]. If multiplets with a finite width must be inverted, rather than singlets as in this experimental example of FIG. 1, it is advisable to use shaped pulses with a "top hat" profile such as $G^3$, I-BURP or $Q^3$ pulses[13-15]. Unfortunately, such sophisticated pulses tend to have a longer duration and they are therefore less suitable for studying fast exchange processes. After a mixing time $\tau_m$, a non-selective 90° monitoring pulse is applied to excite and observe the entire spectrum. The resulting spectra are subtracted from a normal unperturbed spectrum, so that the signals asymptotically decay to zero for large $\tau_m$. As shown in FIGS. 1a through 1c, one can readily observe the migration of magnetization from source to target and from source to perturbing spin components during the mixing time $\tau_m$. In the inventive QUIET-EXSY experiments of FIGS. 1d through 1f, the longitudinal magnetization of the perturbing component is selectively inverted in the middle of $\tau_m$. As a result, the transfer of magnetization from source component to perturbing component is reversed during the second half of $\tau_m$ so that the net transfer is vanishingly small at the end of the mixing period. Thus, the magnetization behaves as if there were no reaction from source to perturbing nor, for that matter, from target to perturbing. The time-dependence of the signals reflects a simplified effective kinetic matrix where only the interconversion of the source and target isomers seems to occur. One might say loosely that the conversion to and from the perturbing form has been "decoupled" by selective inversion. This is illustrated in FIGS. 1d through 1f.

If the exchange rates are fast on the time-scale over which the mixing interval is sampled, the "decoupling" is incomplete, because it is only effective to first order. In such cases, several consecutive inversion pulses can be used, for example at $(\frac{1}{4})\tau_m$ and $(\frac{3}{4})\tau_m$ or more generally at $[(2k+1)/2n]\tau_m$ with k and n integer, in analogy to the QUIET-NOESY and related experiments[11,16,17]. Further insight can be obtained by initially inverting the magnetization of various "source" spins other than that of the source resonance. This would amount to comparing cross-sections taken from two-dimensional exchange matrices at different resonances in the $\omega_1$ domain. Note, however, that the QUIET-EXSY method is inherently one-dimensional.

In systems with more than three sites, it is generally not possible to "decouple" all undesirable sites with a simple monochromatic inversion pulse, unless they happen to be degenerate because of fast exchange. One has the option between simultaneously inverting all sites that should be excluded, or inverting the two sites that one wishes to investigate. The latter approach can easily be implemented in practice by using modulated pulses[11].

The following list of references describes prior art relevant to the present invention and the contents of the listed articles are hereby incorporated by reference into the present specification:

REFERENCES (1) Jackman, L. M.; Cotton, F. A. Ed., "Dynamic NMR Spectroscopy", Academic Press, N.Y., 1975.

(2) Gutowsky, H. S.; Saika, A. J. Chem. Phys. 1953, 21, 1688.

(3) Stevenson, D. S.; Binsch, G. J. Magn. Reson. 1979, 32, 145.

(4) Forsén, S.; Hoffman, R. A. J. Chem. Phys. 1963, 39, 2892.

(5) Forsén, S.; Hoffman, R. A. J. Chem. Phys. 1964, 40, 1189.

(6) Hoffman, R. A.; Forsén, S. J. Chem. Phys. 1966, 45, 2049.

(7) Perrin, C. L.; Johnston, E. R. J. Magn. Reson. 1979, 33, 619.

(8) Meier, B. H.; Ernst, R. R. J. Am. Chem. Soc. 1979, 101, 6441.

(9) Jeener, J.; Meier, B. H.; Bachmann, P.; Ernst, R. R. J. Chem. Phys. 1979, 71, 4546.

(10) Frey, U.; Helm, L.; Merbach, A. Helv. Chim. Act. 1990, 73, 199.

(11) Zwahlen, C.; Vincent, S. J. F.; Di Bari, L.; Levitt, M. II.; Bodenhausen, G. J. Am. Chem. Soc. 1994, 116, 362.

(12) Theimer, D.; Bodenhausen, G. Appl. Magn. Reson. 1992, 3, 981.

(13) Emsley, L.; Bodenhausen, G. J. Chem. Phys. Lett. 1990, 165, 469.

(14) Geen, H.; Freeman, R. J. Magn. Reson. 1991, 93, 93.

(15) Emsley, L.; Bodenhausen, G. J. Magn. Reson. 1992, 97, 135.

(16) Levitt, M. H.; Di Bari L. Phys. Rev. Lett. 1992, 69, 3124.

(17) Levitt, M. H.; Di Bari L. Bull. Magn. Reson. in press

(18) Boulat, B.; Burghardt, I.; Bodenhausen, G. J. Am. Chem. Soc. 1992, 114, 10679.

(19) Burghardt, I.; Konrat, R.; Boulat, B.; Vincent, S.J.F.; Bodenhausen, G. J. Chem. Phys. 1993, 98, 1721.

(20) Zwahlen, C.; Vincent, S.J.F.; Bodenhausen, G., in preparation

We claim:

1. A method for controlling the transfer of magnetization through chemical exchange within a spin system using nuclear magnetic resonance (NMR), comprising: subjecting the spin system having a source spin component, a target spin component, and at least one perturbing spin component to a homogeneous magnetic field; irradiating a first radio frequency (RF) pulse to selectively invert a longitudinal magnetization of the source spin component along a direction of the homogeneous magnetic field; irradiating, at a time $\tau_m/2$ following the first pulse, a second RF pulse to control a transfer of magnetization from the source spin component to the perturbing spin component by selectively inverting either the perturbing spin component or both source and target spin components; and irradiating, at a mixing time interval $_m$ following the first pulse, a third non-selective RF pulse to excite all components for observation of a spin component spectrum by converting a resulting longitudinal magnetization into a transverse magnetization.

2. The method of claim 1, wherein the chemically exchanging spin system is a chemically exchanging system with sites in dynamic equilibrium.

3. The method of claim 1, wherein the first RF pulse is a 180° Gaussian pulse.

4. The method of claim 3, wherein the first Gaussian pulse is truncated at approximately 2.5% to allow investigation of fast exchange processes.

5. The method of claim 1, wherein the first RF pulse is adapted to invert multiplets of finite width.

6. The method of claim 5, wherein the first RF pulse is a $G^3$, a I-BURP, or a $Q^3$ pulse.

7. The method of claim 1, wherein the second RF pulse is adapted to invert multiplets of finite width.

8. The method of claim 7, wherein the second RF pulse is a $G^3$, a I-BURP, or a $Q^3$ pulse.

9. The method of claim 1, wherein the second RF pulse is adapted to selectively invert the perturbing spin component.

10. The method of claim 1, wherein the second RF pulse is adapted to selectively invert both the source and the target spin components.

11. The method of claim 1, wherein the second RF pulse comprises a plurality of n-partial pulses at time intervals $[(2k+1)/2n]\tau_m$ following the first pulse with k and n integers and $0 \leq k \leq n-1$.

* * * * *